(12) United States Patent
Koskelainen

(10) Patent No.: US 8,448,874 B2
(45) Date of Patent: May 28, 2013

(54) METHOD FOR MANUFACTURING A COMPONENT BY ETCHING

(75) Inventor: Tuomas Koskelainen, Pirkkala (FI)

(73) Assignee: Smartrac IP B.V., Amsterdam (NL)

( * ) Notice: Subject to any disclaimer, the term of this patent is extended or adjusted under 35 U.S.C. 154(b) by 0 days.

(21) Appl. No.: 13/139,565

(22) PCT Filed: Dec. 15, 2008

(86) PCT No.: PCT/FI2008/050741
§ 371 (c)(1),
(2), (4) Date: Jun. 14, 2011

(87) PCT Pub. No.: WO2010/070186
PCT Pub. Date: Jun. 24, 2010

(65) Prior Publication Data
US 2011/0253794 A1    Oct. 20, 2011

(51) Int. Cl.
*G06K 19/06*    (2006.01)
(52) U.S. Cl.
USPC .......................................... 235/492; 235/451
(58) Field of Classification Search
USPC ............. 235/451, 492; 340/10.1, 10.2, 572.1, 340/572.2, 572.7; 343/700 MS, 795
See application file for complete search history.

(56) References Cited

U.S. PATENT DOCUMENTS

| | | | | |
|---|---|---|---|---|
| 7,120,987 B2* | 10/2006 | Liu et al. | ......................... | 29/600 |
| 7,339,550 B2* | 3/2008 | Hayama et al. | ............... | 343/895 |
| 7,592,914 B2* | 9/2009 | Sakama et al. | ............. | 340/572.1 |
| 8,006,902 B2* | 8/2011 | Garber et al. | .................. | 235/385 |
| 2002/0011967 A1* | 1/2002 | Goff et al. | ...................... | 343/895 |
| 2006/0032926 A1 | 2/2006 | Baba et al. | | |
| 2007/0008238 A1* | 1/2007 | Liu et al. | ........................ | 343/895 |
| 2007/0200708 A1* | 8/2007 | Hayama et al. | ............. | 340/572.7 |
| 2007/0200782 A1* | 8/2007 | Hayama et al. | ............... | 343/795 |

FOREIGN PATENT DOCUMENTS

| | | |
|---|---|---|
| JP | 61-251035 | 11/1986 |
| JP | 63-236319 | 10/1988 |
| JP | 04-059981 | 2/1992 |
| JP | 2005-157022 | 6/2005 |
| JP | 2006-53833 | 2/2006 |

\* cited by examiner

*Primary Examiner* — Tuyen K Vo
(74) *Attorney, Agent, or Firm* — Birch, Stewart, Kolasch & Birch, LLP

(57) ABSTRACT

A method for manufacturing a component by etching, the component including a substrate and an electrically conductive line configuration supported by the substrate, the electrically conductive line configuration being formed by etching away locally an electrically conductive coating supported by the substrate. An etching mask is used to control locally removal and maintenance of the electrically conductive coating by using an etchant and it includes barrier material on at least one main area corresponding to the electrically conductive line configuration to be maintained during etching. The etching mask further includes at least one sub-area comprising barrier material, the sub-area being arranged at a distance from the edge of the main area. Etchant is applied on the component until areas of electrically conductive coating not protected by the main area of the etching mask and until the area of the electrically conductive coating protected by the sub-area of the etching mask has been substantially removed by the etchant.

15 Claims, 3 Drawing Sheets

METHOD FOR MANUFACTURING A COMPONENT BY ETCHING

FIELD OF THE INVENTION

The invention relates to a method for manufacturing a component by etching, the component comprising a substrate and an electrically conductive line configuration supported by the substrate, the electrically conductive line configuration being formed by etching away locally by etchant an electrically conductive coating supported by the substrate, and in which method an etching mask is used to control locally removal and maintenance of the electrically conductive coating by using etchant.

Further the invention relates to an etching mask for manufacturing a component by etching, the component comprising a substrate and an electrically conductive line configuration supported by the substrate, the electrically conductive line configuration being formed by etching away locally by etchant an electrically conductive coating supported by the substrate, the etching mask determining the electrically conductive line configuration of the component.

Further the invention relates to a component comprising a substrate and an electrically conductive line configuration supported by the substrate.

BACKGROUND OF THE INVENTION

Typically in the etching of printed circuit boards or other corresponding electronic components or products etching process variations can cause significant deviation of electrical characteristics of the electric circuits between successively etched similar etched circuits. This is especially true when etching high frequency structures such as antenna structures. In the etching of antennas for radio frequency identification tags, RFID tags, for example, the process variations in the etching can cause frequency behaviour variation in the etched antennas, which are typically made of copper or aluminium. In the antennas or in some other, especially high-frequency conductors, the shape and smoothness of edges, especially in curved or corner areas, and the smoothness of the thickness and width of the conductors may have an extensive effect on the frequency or tuning properties of the conductors. An extensive variation in the frequency or tuning properties is not allowable in products like RFID tags to be attached with items sold in department stores, for example, because reading information stored in the tags must happen at a very accurately specified frequency. So, in order to avoid failures or otherwise reduced performance in reading the information stored in the RFID tag, the frequency properties of the antennas in the tags may not essentially vary.

JP-publication 61251035 discloses an arrangement in etching process of wafers. The arrangement comprises a sample electrode and a wafer to be etched located on top of the sample electrode. The arrangement further comprises etchant consuming materials, separate from the wafer and arranged on top of the sample electrode, outside the periphery of the wafer to be etched. The purpose of the usage of the etchant consuming materials is to make the feed rate of the etchant in the surface of the wafer more constant by the working of the etchant consuming materials and in such a way to increase the uniformity of the etching rate on the surface of the wafer to be etched, thereby trying to increase the reproducibility of the etching process of wafers. However, such an arrangement is not enough to ensure good repeatability in etching of items with complicated patterns with significant number of smaller important details.

BRIEF DESCRIPTION OF THE INVENTION

An object of the present invention is to provide a new type of solution for etching components comprising electric circuits.

The method according to the invention is characterized in that the etching mask comprises barrier material on at least one main area corresponding to the electrically conductive line configuration to be maintained during etching and that the etching mask further comprises at least one sub-area comprising barrier material, the sub-area being arranged at a distance from the edge of the main area and that the etchant is applied on the component until areas of electrically conductive coating not protected by the main area of the etching mask and until the area of the electrically conductive coating protected by the sub-area of the etching mask has been substantially removed by the etchant.

The etching mask according to an invention is characterized in that the etching mask comprises barrier material on at least one main area corresponding to the electrically conductive line configuration to be maintained during etching and that the etching mask further comprises at least one sub-area comprising barrier material, the sub-area being arranged at a distance from the edge of the main area.

The component according to the invention is characterized by the electrically conductive line configuration being manufactured according to any one of claims 1 to 6.

In a method for manufacturing a component comprising a substrate and an electrically conductive line configuration supported by the substrate, the electrically conductive line configuration being is formed by etching away locally by etchant an electrically conductive coating supported by the substrate. Further an etching mask is used to control locally removal and maintenance of the electrically conductive coating by using etchant, the etching mask comprising barrier material on at least one main area corresponding to the electrically conductive line configuration to be maintained during etching. The etching mask further comprises at least one sub-area comprising barrier material, the sub-area being arranged at a distance from the edge of the main area. Further the etchant is applied on the component until areas of electrically conductive coating not protected by the main area of the etching mask and until the area of the electrically conductive coating protected by the sub-area of the etching mask has been substantially removed by the etchant.

By using an etching mask comprising at least one sub-area comprising barrier material of the etching mask, the sub-area being arranged at a distance from the main area corresponding to the electrically conductive line configuration to be maintained during etching, a temporary supporting and/or stabilizing area can be provided next to the electrically conductive line configuration to be maintained, the temporary supporting and/or stabilizing area stabilizing the effect of the etchant fluid on the electrically conductive line configuration to be maintained.

According to an embodiment the etching mask comprises at least one first sub-area and at least one second sub-area comprising barrier material, the first sub-area and the second sub-area surrounding at least partially the main area at a distance from the edges of the main area, the second sub-area surrounding the main area on the opposite side of the main area substantially in the same plane in the direction of the surface of the substrate with respect to the first sub-area.

By using several sub-areas, which at least partly or substantially totally surround the main area of the etching mask corresponding to the electrically conductive line configuration to be maintained during etching, the effect of the etchant may be controlled on both sides of the electrically conductive line configuration to be maintained during etching.

According to a second embodiment of the invention, the component to be manufactured is arranged to form a part of a radio frequency identification tag and that the electrically conductive line configuration is arranged to correspond the antenna of the radio frequency identification tag.

The use of the sub-areas for providing supporting and/or stabilizing areas during etching of the electrically conductive line configuration is very useful in the etching of the antennas intended to be used in radio frequency identification tags, because especially in the high-frequency applications the smoothness of the edged of the antenna may have an extensive effect on the frequency or tuning properties of the antenna.

BRIEF DESCRIPTION OF THE DRAWINGS

In the following the invention will be described in greater detail by means of preferred embodiments with reference to the attached [accompanying] drawings, in which.

DETAILED DESCRIPTION OF THE INVENTION

Figure 1:
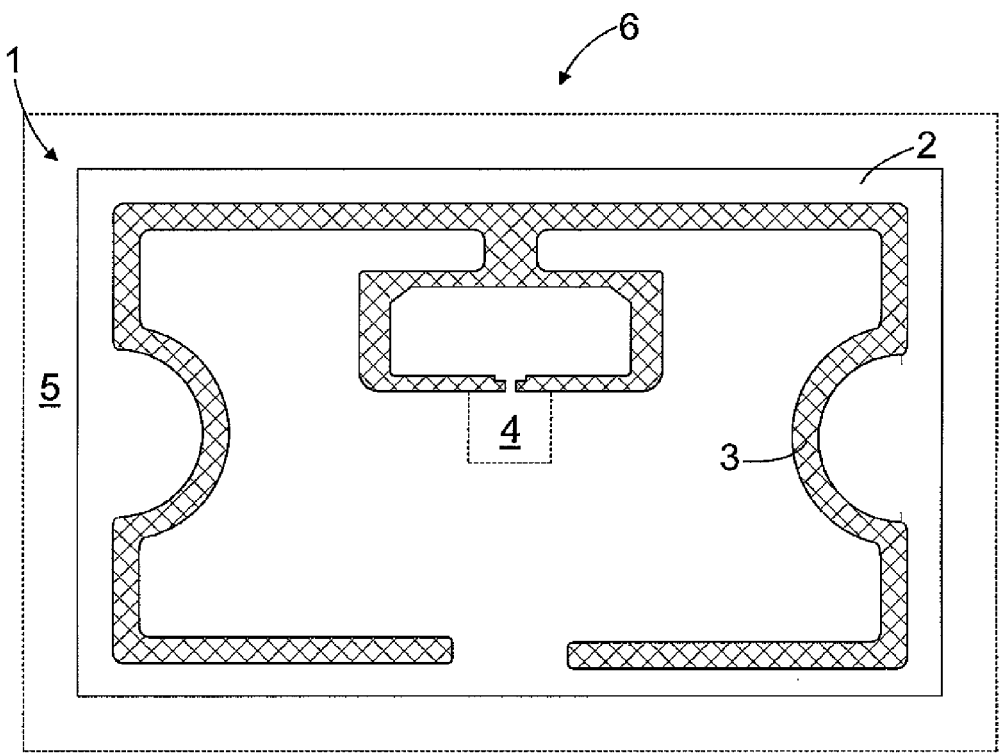
FIG. 1 is a schematic top view of a component comprising an electrically conductive line configuration.

FIG. 1 shows schematically a top view of a component 1. The component 1 comprises a substrate 2 and an electrically conductive line configuration 3. The component 1 may form a part of a radio frequency identification tag, which m ay be used in many different kind of applications. RFID tags may, for example, be attached to different kind of items sold in department stores, for storing specific information relating to the items they are attached to. When using the component 1 in the manufacturing of the RFID tag, the electrically conductive line configuration 3 is to be manufactured to function as an antenna of the tag. Thereafter an integrated circuit 4 or chip 4, shown schematically by a box with a broken line, is arranged in connection with the antenna, in order to store specific information relating to the item the RFID tag is attached to. After that, the component 1 comprising further the integrated circuit 4 is attached to a pressure sensitive adhesive, i.e. sticker 5 or some other kind of attachment element, thus providing a finished RFID tag 6 ready to be attached to the items to be sold in the department store, for example. In FIG. 1, the sticker 5 has been schematically shown by a box with a broken line surrounding the component 1. In addition to the basic elements shown in FIG. 1, the RFID tag may also contain other layers laminated or otherwise attached to the structure.

In the RFID tags, the electrically conductive line configuration forming an antenna provides means to transfer information between the tag and a device for reading the information stored in the tag or a device for sending information to be stored in the tag. RFID tags may be passive, semi-passive or active depending on how the tag is powered and also on how much integrated circuit intelligence is added to the tag. A passive RFID tag does not contain any separate power source of its own but is powered by the electromagnetic interrogation field created by the outside reader device. An active RFID tag may have a battery source and thus be able to transmit a signal by its own. A variety of different types of RFID tags lies in between these extremes.

The basic structures and operation principles of RFID tags are generally known for the person skilled in the art and therefore those items are not discussed further in this text. For the present solution, the discussion is focused especially for producing high performance antennas for RFID tags by etching, but it is obvious that the same solution may be utilized in etching of other electrically conductive line configurations too.

The problem relating to the manufacturing of electric circuits, like antennas in RFID tags, by etching, are etching process variations causing deviation of electrical characteristics of the electric circuits. The shape and smoothness of edges, especially in curved areas and corners, and the smoothness of the thickness and width of the antenna conductors may have an extensive effect on the frequency or tuning properties of the antenna. An extensive variation in the frequency or tuning properties of antennas is not, however, allowable, because reading information stored in the tags must be done with a very accurately specified frequency. Therefore manufacturing method for providing only minor deviations in the electrical characteristics of the electric circuits is needed to maximize the performance of such antennas. It should be noted that the current and voltage levels typically generated in the RFID circuitry, especially in passive tags, are very small and even smaller deficiencies in the electric performance of the antennas can lead to significant reduce in reading distance or accuracy.

Figure 2:
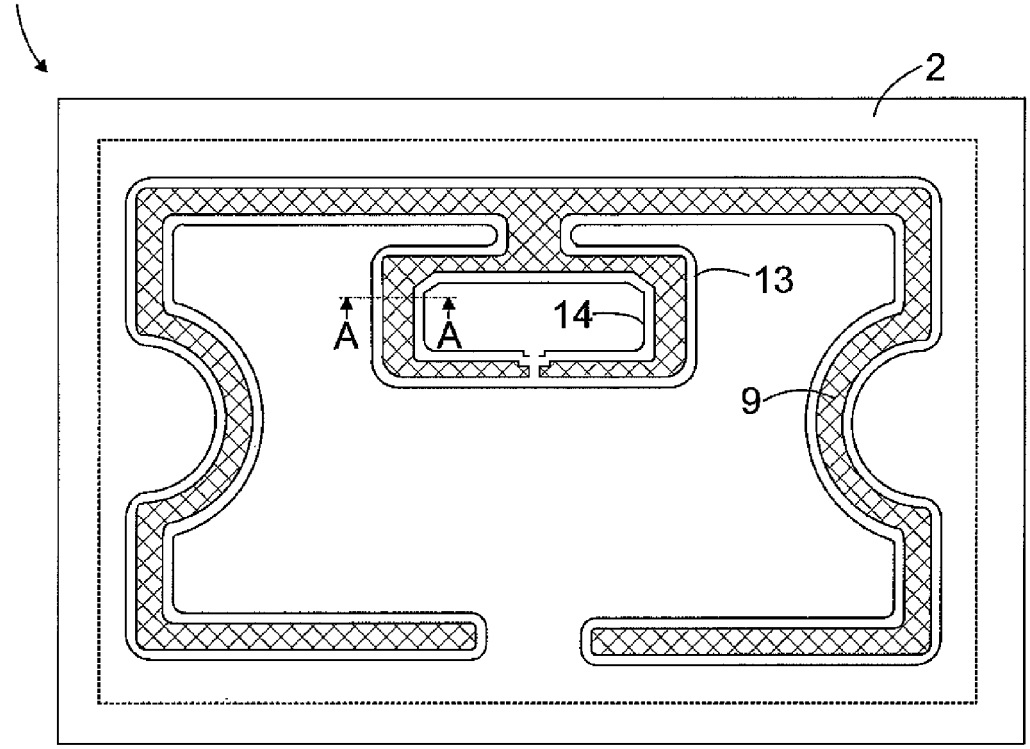
FIG. 2 is a schematic top view of a component according to FIG. 1 at some phase during the manufacturing of the component.
Figure 3:
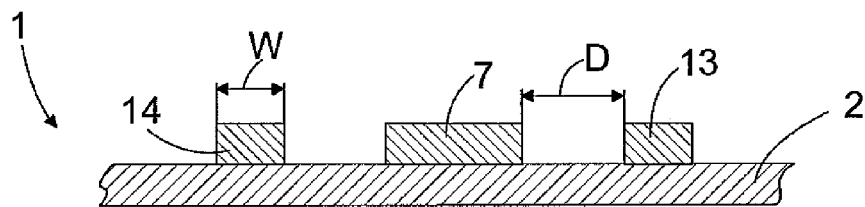
FIG. 3 is a schematic side view in cross-section of the unfinished component shown in FIG. 2.
Figure 4:
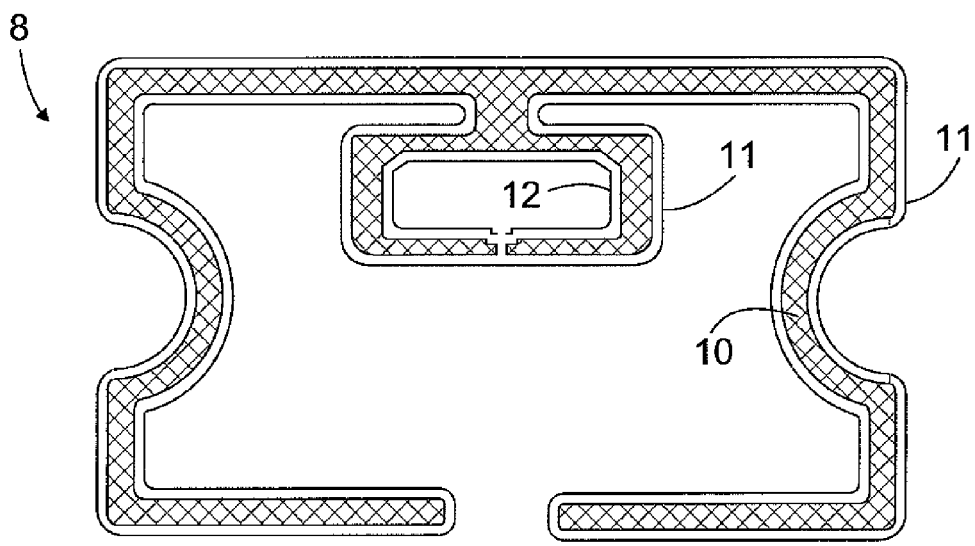
FIG. 4 is a schematic top view of a second etching mask used in manufacturing of the component according to FIGS. 1 to 3.

FIG. 2 shows schematically a top view of a component 1 according to FIG. 1 at a manufacturing phase of an antenna 7, the antenna 7 being the electrically conductive line configuration of the component 1. FIG. 3 shows schematically the side view in cross-section of the component 1 presented in FIG. 2. FIG. 4 shows schematically an etching mask 8, which can be used in the manufacturing of the component 1.

The component 1 comprises the substrate 2 and an antenna 7, the antenna thus being the electrically conductive line configuration of the component 1. The substrate 2 is typically made of plastic material, such as PET, for example. At the starting phase of the etching of the antenna, there is a layer of an electrically conductive coating on the top of the substrate 2, the substrate 2 thus supporting the electrically conductive coating. This electrically conductive coating is typically some kind of metal coating, typically copper or aluminium, and it forms an antenna blank or preform, from which the antenna 7 can be manufactured by etching away part of the electrically conductive coating. Contours of the electrically conductive coating before etching of the antenna 7 has been illustrated in FIG. 2 by a broken line and marked with a reference number 9.

When starting the etching of the antenna 7, the etching mask 8 according to FIG. 4 is arranged on top of the substrate 2 comprising the electrically conductive coating 9. The etching mask 8 comprises the etching mask material or barrier material on a main area 10 of the etching mask 8, the shape of the main area 10 corresponding the shape of the antenna 7 to be maintained after etching. The etching mask 8 further comprises barrier material on a first sub-area 11 surrounding the main area 10. The first sub-area 11 has a form of line and it follows the shape of the outer edge of the main area 10 at a distance from the main area 10. The etching mask 8 further comprises barrier material on a second sub-area 12 surrounding the main area 10 on the inner side of the main area 10. The second sub-area 12 has a form of line and it follows the shape of the inner edge of the main area 10 at a distance from the main area 10.

Typically, the etching mask 8 is arranged on the top of the substrate 2 such that in the first phase the whole substrate is coated by mask material or resist material. After that the mask pattern is exposed in the mask material and then either the exposed or un-exposed part of the mask material is removed by etchant, depending whether positive or negative photoresistive mask material is used. In the etching of antennas typically negative photoresistive mask material is used. Also other kind of ways generally known for the person skilled in the art are available for arranging the etching mask 8 on the on the top of the substrate 2, such as the use of different kind of etchant resistive protective materials, such as paint, for example but the above explained method being based on the photolithography is the most used in the etching of fine patterns or line configurations.

After the etching mask 8 according to FIG. 4 has been arranged on top of the component 1 comprising substrate 2 comprising the electrically conductive coating 9, etchant is applied on the component 1. The etchant removes the electrically conductive coating on the parts of the coating not protected by the barrier material in the main area 10 and in the sub-areas 11 and 12 of the etching mask 8. Thus, at some point of etching, the component 1 comprises the electrically conductive line configuration corresponding to the antenna 7. Similarly, at some point of etching, the component 1 further comprises line 13 surrounding the antenna 7 at a distance of the outer edge of the antenna 7 and following the shape of the outer edge of the antenna 7 and line 14 following the shape of the inner edge of the antenna 7 at a distance of the inner edge of the antenna 7. Lines 13 and 14 originate from the protective effect of the first sub-area 11 and the second sub-area 12 of the etching mask 8. So, the etchant has removed other parts of the electrically conductive coating 9 away from the component 9.

In practise, the etching effect is also at least in some extent directed sideways under the barrier material. When further continuing etching, the etchant will continue to remove the electrically conductive coating 9 away also under the barrier material corresponding to the main area 10 and the sub-areas 11 and 12 of the etching mask 8 such that at some further phase of the etching, the lines 13 and 14 have been substantially totally etched away under the barrier material corresponding to the sub-areas 11 and 12 of the etching mask 8, in which phase the etching process may be stopped.

By using the sub-areas 11 and 12 in the etching mask 8, the temporary lines 13 and 14 can be formed next to the antenna structure 7 to be manufactured. These temporary lines 13 and 14 form temporary supporting and/or stabilizing lines or structures for the etching of the antenna 7. The effect of these supporting lines 13 and 14 is very positive to the etching of the antenna 7. The supporting lines 13 and 14 provide a temporary and localized supporting and/or stabilizing environment for the etchant so that the etching effect on the antenna 7 to be etched remains more stable than in the case without such supporting lines. The advantage of this is that the structure of the antenna between successive components to be etched remains uniform, providing adequate shape and smoothness characteristics of edges of the antenna, also in curved areas or corners, and adequate smoothness and thickness and width of the antenna conductor, the antenna thus providing stable frequency and tuning properties of the antenna. The antenna-to-antenna variations within an etching batch as well as the batch-to-batch variations in electric performance of the antennas is significantly removed.

Due to the narrowness of the temporary supporting lines, the etchant has some etching effect also sideways, this leading to the fact that the properly designed temporary supporting lines 13 and 14 become removed from the component 1. The thickness of the metal layer, i.e. the thickness of the electrically conductive coating to be etched away defines the sideways area that the etchant can affect. With properly selected width of the temporary supporting lines 13 and 14 in combination with long enough etching time, the temporary supporting lines will be etched away by the etchant sideways even if the protective layer of the barrier material of the etching mask 8 protects the lines from being etched from the top surface.

The width of the temporary supporting lines 13 and 14 may vary depending on the manufacturing material of the electrically conductive coating, the shape or structure of the antenna and the etching process to be used. For example, the distance D between the edge of the antenna 7 and the supporting lines may vary between 50 to 70 micrometers and the width W of the supporting lines may vary between 80 to 250 micrometers for aluminium and a specific antenna structure. However, depending on the antenna structure and the etching process to be used, the presented values may vary significantly. The thickness of the electrically conductive coating varies also depending on the material of the electrically conductive coating, but when aluminium or copper is in question, the typical thickness of the electrically conductive coating varies between few micrometers to tens of micrometers.

Figure 5:
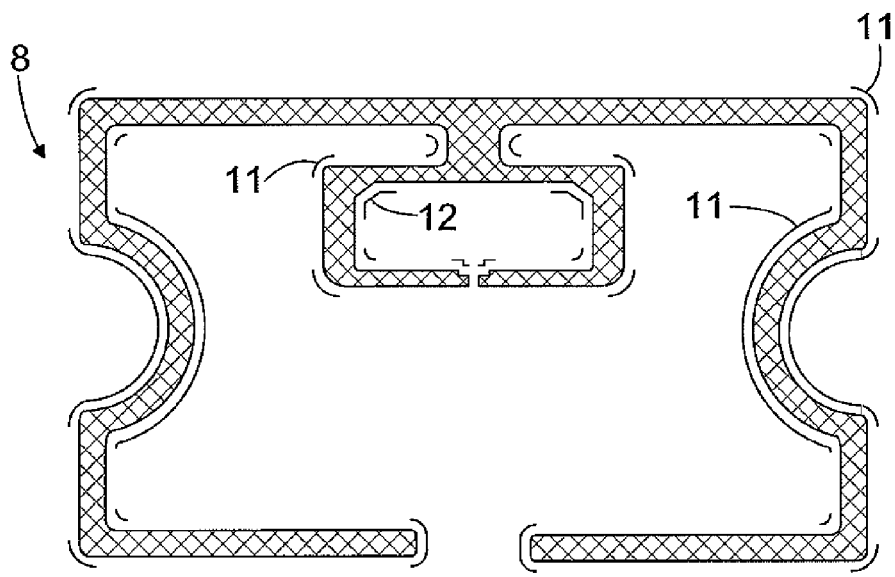
FIG. 5 is a schematic top view of another etching mask which can be used in manufacturing of a component and FIG. 6 is a schematic top view of a second possible electrically conductive line configuration.

In FIG. 4, the etching mask 8 comprises one first sub-area 11 and one second sub-area 12, both of them surrounding substantially the whole length of the edges of the antenna 7 on their corresponding sides of the antenna 7. However, it is also possible that there are several first sub-areas 11 and several second sub-areas 12 arranged at a distance from the edge of the main area 10 of the etching mask 8. This type of etching mask is schematically shown in FIG. 5, wherein there are several first sub-areas 11 and second sub-areas 12 arranged only in the curved areas or corners of the antenna structure to be etched, because the shape and smoothness of the edges of the antenna especially in curved and corner areas may have the most extensive effect on the frequency or tuning properties of the antenna structures, the straight portions having less critical effect on the frequency and tuning properties.

Also that kind of embodiment is possible wherein there is only one sub-area of the etching mask 8 provided next to the main area of the etching mask 8, the sub-area located at the most critical point with respect to the antenna structure to be etched when considering the frequency and tuning properties of the antenna to be etched.

Figure 6:
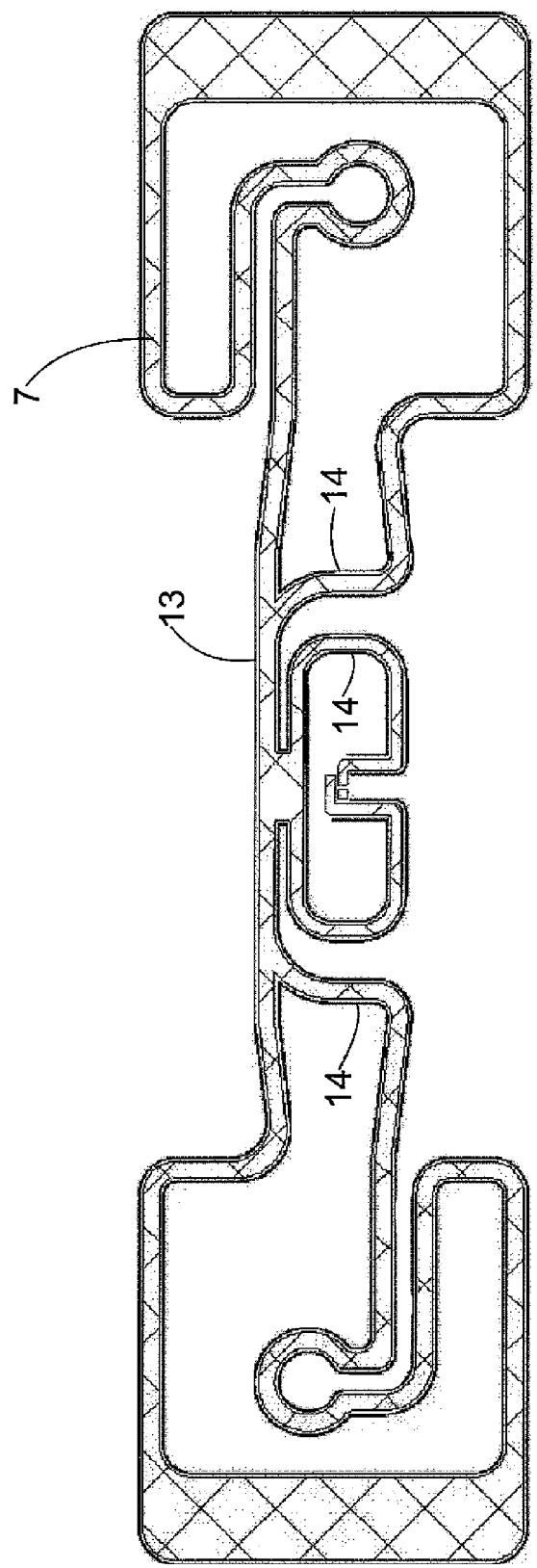

FIG. 6 shows a second embodiment of an antenna structure 7, which may be implemented by the solution presented. FIG. 6 shows the antenna structure in the manufacturing phase wherein the supporting lines are still visible. The shape or structure of the antenna 7 is more complicated, comprising a higher number of corners or curved areas. With this kind of the antenna structure the use of the solution is very useful when good frequency and tuning properties of the antenna structure must be achieved.

In FIGS. 1 to 6 it is shown only one etching mask 8 and only one either finished or unfinished component 1. However, the etching process is typically applied for manufacturing several components 1 simultaneously, in which case several preforms of the components 1 may be arranged on sheets for providing a process, which processes the preforms of the components 1 sheet by sheet. It is also possible to arrange the preforms of the components on a web and thus continuously process the web running from one roll to another.

The fluid used as the etchant is typically sprayed on the surface of the electrically conductive coating and the resistive etching mask. The time used for etching may be for example about 30 seconds and the object to be etched typically moves through the etching device during the etching process. The last phase of the etching process is typically cleansing of the etched surface. In the manufacturing process it is also possible to interrupt the etching by interrupting the applying of the etchant on the component and to check, whether the supporting lines 13 and 14 have been etched away, i.e. to check the presence of the electrically conductive coating below one or more sub-areas 11 and 12. In the case that the supporting lines 13 and 14 are still present, meaning that there is still electrically conductive coating left below one or more sub-areas, the etching process may be continued by continuing the applying of the etchant on the component. This means that on the basis of the presence of the supporting lines or structures the processing time used for etching may be controlled and the supporting lines may be used as indicators for the progression of the etching process.

It will be obvious to a person skilled in the art that, as the technology advances, the inventive concept can be implemented in various ways. The invention and its embodiments are not limited to the examples described above but may vary within the scope of the claims.

The invention claimed is:

1. A method for manufacturing a radio frequency identification tag component by etching, the component comprising a substrate and an electrically conductive line configuration supported by the substrate, the electrically conductive line configuration corresponding to an antenna of the radio frequency identification tag and being formed by etching away locally by an etchant an electrically conductive coating supported by the substrate, and in which method an etching mask is used to control locally removal and maintenance of the electrically conductive coating by using an etchant, wherein the etching mask comprises barrier material on at least one main area corresponding to the electrically conductive line configuration to be maintained during etching and the etching mask further comprises at least one first sub-area and at least one second sub-area, both the first and second sub-areas having a form of a line and conforming to the shape of an outer edge of the at least one main area of the etching mask and comprising barrier material, the second sub-area surrounding the main area on the opposite side of the main area substantially in the same plane in the direction of the surface of the substrate with respect to the first sub-area such that substantially the whole main area is surrounded by the first and second sub-areas on both sides at a distance from the edges of the main area, and the etchant is applied on the component until areas of electrically conductive coating not protected by the main area of the etching mask and until the areas of the electrically conductive coating protected by the first and second sub-areas of the etching mask has been substantially removed by the etchant.

2. The method according to claim 1, wherein the area of the electrically conductive coating corresponding to the first and second sub-areas of the etching mask comprising barrier material provides a supporting and/or stabilizing structure for the worth of the etching of the electrically conductive line configuration such that the etchant substantially removes the electrically conductive coating corresponding to the first and second sub-areas of the etching mask by the time the etching of the electrically conductive line configuration has been finished.

3. The method according to claim 2, wherein the area of the electrically conductive coating corresponding to the first and second sub-areas of the etching mask comprising barrier material is an area in the form of line running parallel to the main area corresponding to the conductor configuration of the electrically conductive line configuration.

4. The method according to claim 2, further comprising the steps of:
   interrupting the applying of the etchant on the component;
   checking the presence of the electrically conducting coating below the first and second sub-areas; and
   continuing the applying of the etchant on the component if there is still electrically conducting coating left below the first and second sub-areas.

5. A radio frequency identification tag component comprising a substrate and an electrically conductive line configuration supported by the substrate, the electrically conductive line configuration corresponding to an antenna of the radio frequency identification tag, wherein the electrically conductive line configuration being manufactured according to claim 2.

6. The method according to claim 1, wherein the area of the electrically conductive coating corresponding to the first and second sub-areas of the etching mask comprising barrier material is an area in the form of line running parallel to the main area corresponding to the conductor configuration of the electrically conductive line configuration.

7. The method according to claim 6, further comprising the steps of:
   interrupting the applying of the etchant on the component;
   checking the presence of the electrically conducting coating below the first and second sub-areas; and
   continuing the applying of the etchant on the component if there is still electrically conducting coating left below the first and second sub-areas.

8. A radio frequency identification tag component comprising a substrate and an electrically conductive line configuration supported by the substrate, the electrically conductive line configuration corresponding to an antenna of the radio frequency identification tag, wherein the electrically conductive line configuration being manufactured according to claim 6.

9. The method according to claim 1, further comprising the steps of:
   interrupting the applying of the etchant on the component;
   checking the presence of the electrically conducting coating below the first and second sub-areas; and
   continuing the applying of the etchant on the component if there is still electrically conducting coating left below the first and second sub-areas.

10. A radio frequency identification tag component comprising a substrate and an electrically conductive line configuration supported by the substrate, the electrically conductive line configuration corresponding to an antenna of the radio frequency identification tag, wherein the electrically conductive line configuration being manufactured according to claim 9.

11. A radio frequency identification tag component comprising a substrate and an electrically conductive line configuration supported by the substrate, the electrically conductive line configuration corresponding to an antenna of the radio frequency identification tag, wherein the electrically conductive line configuration is manufactured according to claim 1.

12. An etching mask for manufacturing a radio frequency identification tag component by etching, the component comprising a substrate and an electrically conductive line configuration supported by the substrate, the electrically conductive line configuration corresponding to an antenna of the radio frequency identification tag and being formed by etching away locally by an etchant an electrically conductive coating supported by the substrate, the etching mask determining the electrically conductive line configuration of the component, wherein the etching mask comprises barrier material on at least one main area corresponding to the electrically conductive line configuration to be maintained during etching and the etching mask further comprises at least one first sub-area and at least one second sub-area, both the first and second sub-areas having a form of a line and conforming to the shape of an outer edge of the at least one main area of the etching mask and comprising barrier material, the second sub-area surrounding the main area on the opposite side of the main area substantially in the same plane in the direction of the surface of the substrate with respect to the first sub-area such that substantially the whole main area is surrounded by the first and second sub-areas on both sides at a distance from the edges of the main area.

13. The etching mask according to claim 12, wherein the first and second sub-areas of the etching mask comprising barrier material is arranged to provide a supporting and/or stabilizing structure from the corresponding part of the electrically conductive coating for the worth of the etching of the electrically conductive line configuration until the etching of the electrically conductive line configuration has been finished.

14. The etching mask according to claim 13, wherein the first and second sub-areas of the etching mask comprising barrier material is an area in the form of line running parallel to the main area corresponding to the conductor of the electrically conductive line configuration.

15. The etching mask according to claim 12, wherein the first and second sub-areas of the etching mask comprising barrier material is an area in the form of line running parallel to the main area corresponding to the conductor of the electrically conductive line configuration.

\* \* \* \* \*